US007978505B2

United States Patent
Zhou

(10) Patent No.: US 7,978,505 B2
(45) Date of Patent: Jul. 12, 2011

(54) HEAT ASSISTED SWITCHING AND SEPARATED READ-WRITE MRAM

(75) Inventor: Yuchen Zhou, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 358 days.

(21) Appl. No.: 12/322,107

(22) Filed: Jan. 29, 2009

(65) Prior Publication Data

US 2010/0188893 A1    Jul. 29, 2010

(51) Int. Cl.
    *G11C 11/00* (2006.01)
(52) U.S. Cl. .................. 365/158; 365/171; 365/173
(58) Field of Classification Search ............ 365/158, 365/171, 173
    See application file for complete search history.

(56) References Cited

U.S. PATENT DOCUMENTS

| | | | |
|---|---|---|---|
| 5,640,343 A | 6/1997 | Gallagher et al. | |
| 6,603,678 B2 | 8/2003 | Nickel et al. | |
| 6,771,534 B2 | 8/2004 | Stipe | |
| 6,885,573 B2 | 4/2005 | Sharma et al. | |
| 6,911,685 B2 | 6/2005 | Anthony et al. | |
| 6,961,263 B2 | 11/2005 | Smith et al. | |
| 7,009,877 B1 | 3/2006 | Huai et al. | |
| 7,180,770 B2 | 2/2007 | Perner et al. | |
| 7,372,116 B2 * | 5/2008 | Fullerton et al. | 257/421 |
| 7,397,074 B2 | 7/2008 | Nickel | |
| 2006/0291276 A1 | 12/2006 | Nozieres et al. | |
| 2007/0184613 A1 | 8/2007 | Kim et al. | |
| 2007/0189064 A1 | 8/2007 | Min et al. | |

* cited by examiner

*Primary Examiner* — Son T Dinh
*Assistant Examiner* — Nam T Nguyen
(74) *Attorney, Agent, or Firm* — Saile Ackerman LLC; Stephen B. Ackerman

(57) ABSTRACT

A MRAM structure is described that has a dedicated data storage layer formed between first and second electrodes and a dedicated data sensing layer between second and third electrodes to enable separate read and write functions. A diode between the storage layer and first electrode allows a heating current to flow between first and second electrodes to switch the data storage layer while a field is applied. A second diode between the sensing layer and third electrode enables a sensing current to flow only between second and third electrodes during a read process. Data storage and sensing layers and the three electrodes may be arranged in a vertical stack or the sensing layer, second diode, and third electrode may be shifted between adjacent stacks each containing first and second electrodes, a storage layer, and first diode. Second electrode and the sensing layer may be continuous elements through multiple MRAMs.

31 Claims, 4 Drawing Sheets

HEAT ASSISTED SWITCHING AND SEPARATED READ-WRITE MRAM

FIELD OF THE INVENTION

The invention relates to a high performance Magnetoresistive Random Access Memory (MRAM) cell design in which a center electrode is introduced between storage and sensing layers, and switching of the storage layer is assisted by current heating thereby producing a magnetic field in the sensing layer and inducing a resistance change.

BACKGROUND OF THE INVENTION

MRAM, based on the integration of silicon CMOS with magnetic tunnel junction (MTJ) technology, is a major emerging technology that is highly competitive with existing semiconductor memories such as SRAM, DRAM, Flash, etc. A conventional MRAM device generally includes two magnetic layers. Magnetization of one layer is always pinned in a certain direction either through an exchange coupling field from other layers such as in a synthetic anti-ferromagnetic (SAF) structure, or through internal anisotropy of the pinned layer itself. The pinned layer serves as the reference layer (RL) for the second magnetic layer (free layer or FL) whose magnetic moment is free to switch from a direction parallel to that of the pinned layer (low resistance state) to a direction anti-parallel to the pinned layer (high resistance state), or vice versa. The FL, RL, and a third non-magnetic layer formed between the free and pinned layers form a magnetoresistive (MR) junction so that when FL magnetization direction rotates due to an applied magnetic field, the resistance change across the junction is measured by a voltage signal from a DC current applied across the junction. When the middle non-magnetic layer is a metal, the resulting junction is a Giant Magnetoresistive (GMR) sensor and when the middle non-magnetic layer is a dielectric material, a tunneling magnetoresistive (TMR) sensor is established. Thus, by flipping FL magnetization between two distinctive magnetization states defined by either shape anisotropy or other anisotropies, which do not exchange spontaneously, the junction can serve as a magnetic memory unit (cell) for data storage. In a MRAM cell, FL is also referred to as a storage layer and the middle non-magnetic layer is typically a dielectric material.

Switching of the storage layer magnetization can be accomplished by an external field. In MRAM, each single cell is required to be switchable without switching other cells. In conventional field MRAM, two current carrying metal lines cross above and below a given MRAM cell in a crosspoint configuration so that the total field generated by the current from the two lines is able to switch only the cell where they intersect. However, in reality, the magnetic field still exists although at a reduced level for all cells that lie on either of the two metal lines thereby causing a so called "half-select" problem which requires a higher energy barrier to switch each cell. Another characteristic of MRAM is that intrinsic switching field distribution (SFD) of each cell requires a low switching field to guarantee 100% success rate during switching. Therefore, the two intrinsic problems (half-select and SFD) make conventional field switching MRAM difficult to optimize because of a narrow operation margin.

Additional effort relating to the field switching scheme to enable less perturbing of non-switching cells and easier switching of switching cells is to locally reduce the magnetic energy barrier for switching by introducing heating of the cell to be switched. Several prior art examples are mentioned below and are mainly focused on using a high anisotropy material, either by intrinsic crystalline anisotropy or exchange coupling to an anti-ferromagnetic material, whose anisotropy energy decreases as temperature increases. U.S. Pat. No. 6,603,678 describes a magnetic memory element that is written to by heating the memory element and applying at least one magnetic field to the memory element. In U.S. Pat. No. 7,771,534, a MRAM has a free magnetic electrode and a stable magnetic electrode with an adjacent oxide layer. The oxide layer has a resistance at levels to allow sufficient power dissipation to lower the anisotropy of the free magnetic electrode through current induced heating. U.S. Pat. No. 6,961,263 discloses a magnetic storage cell with a set of conductors used to write data to a storage cell and a second set of conductors used to heat the magnetic storage cell and read data from the magnetic storage cell. In U.S. Patent App. Publication 2006/0291276, the operating temperature of the reading memory or resting memory is selected in such a way that it is lower than the blocking temperature of the free and trapped layers. U.S. Pat. No. 6,911,685 describes a thermally assisted magnetic memory structure with a first conductor surrounded by cladding, a memory cell thermally isolated from the first conductor, and a second conductor electrically contacting the memory cell. U.S. Pat. No. 7,180,770 discloses a storage device which includes a plurality of heating elements connected in series with magnetic memory elements in which each heating element comprises a diode that produces heat to facilitate the device write function.

The operation of designs in the aforementioned prior art relies on a current flowing through the device to generate heat in the data storage layer to enable switching of the data storage layer. While a half-select field still exists in other devices due to heating not being exerted, accidental switching is avoided by a high anisotropy field in the storage layer. It is important to note in the prior art that the data storage layer is always part of the signal generation layer such as a free layer or reference layer of a MR junction. Furthermore, the current needed for heating is usually not insignificant. As a result, if the current heating up the data storage layer also passes through the MR junction, the junction material which is usually an oxide for higher signal from a MRAM cell, can degrade over time and may impose practical reliability concerns.

The most recent MRAM scheme (STT-RAM) utilizes a spin-torque effect where an electric current flowing from one magnetic layer to a second magnetic layer is able to impose magnetic torque on the magnetizations of the layers. In the spin-torque effect, the data storage layer's magnetization in a given MRAM cell is switchable by a localized current flowing through the cell and thereby eliminates the half-select problem. However, a significant amount of current still flows through the tunnel barrier layer (MR junction) which means junction reliability continues to be a practical concern because of high current density.

In other prior art references, U.S. Patent App. Publication 2007/0189064 describes a random access memory cell that can store multiple information states in a single bit. A conventional MTJ is magnetostatically coupled to a reference stack and the magnetic moment of the free layer can be changed in small increments with each unique direction corresponding to a different information state. In U.S. Pat. No. 7,009,877, a magnetic memory device is disclosed and includes a spin transfer driven element disposed between a first terminal and a second terminal, and a readout element disposed between the second terminal and a third terminal. A phase change RAM (PRAM) is illustrated in U.S. Patent Application 2007/0184613 and includes a resistance element having a diode function. The PRAM may have a substrate, a phase change diode layer formed on the substrate, and an upper electrode on the phase change diode layer.

SUMMARY OF THE INVENTION

One objective of the present invention is to provide a MRAM cell design that reduces switching field distributions and half select effects compared to prior art MRAM structures.

A second objective of the present invention is to provide a MRAM design that features separate writing and reading components to enable separate optimization of sensing and storage layers and features a heating current pathway through the storage layer that does not cause sensor degradation.

A third objective of the present invention is to provide a MRAM storage layer according to the second objective that produces a large enough field to influence a sensing layer while maintaining a stable data-retaining state by using either optimum thickness high anisotropy material or a laminated ferromagnetic/anti-ferromagnetic structure.

A fourth objective is to enable reading of a stored magnetic state in the storage layer of the novel MRAM by a high sensitivity magnetoresistive sensor based on free layer magnetization rotation rather than on an external switching mechanism.

A fifth objective is to provide a MRAM having a top-down vertical structure with integrated diodes to enable a single pillar MRAM cell for high density data storage.

According to a first embodiment of the present invention, these objectives are achieved with a MRAM structure that includes three electrodes which separate the memory cell into two sections including one section that comprises a dedicated magnetic data storage layer and a second section which comprises a dedicated magnetic data reading layer. The magnetic data reading layer is positioned between the second and third electrodes and abuts one side of the second electrode. The magnetic data storage layer is formed between the first and second electrodes and abuts an opposite side of the second electrode with respect to the magnetic reading layer. An important feature is that the data storage layer is comprised of high anisotropy material whose magnetization is switched by a simultaneous application of a magnetic field and thermal heating. In particular, the anisotropy decreases as the temperature is increased during a heating event. The data storage layer may be a multi-layer stack formed by a pair of ferromagnetic (FM) and anti-ferromagnetic (AFM) layers wherein the AFM layers pin the FM layers through exchange coupling and the AFM property is lost at elevated temperatures. In a second embodiment, the data storage layer may be formed by interlacing (laminating) a plurality of AFM and FM layers in an alternating configuration. Between the third electrode and data reading layer and between the first electrode and data storage layer are electric current routing components that allow current to flow into only the data reading layer or only into the data storage layer, respectively, at any moment in time.

In one embodiment, the data storage layer is comprised of a hard magnetic material with anisotropy determined by crystalline structures. In another embodiment, the data storage layer is made of a super-lattice structure having a high perpendicular anisotropy. The super-lattice may be a laminate of magnetic and non-magnetic films or a laminate of magnetic films having different compositions such as $(Co/Ni)_n$. The data reading layer is a MR device that has at least one free layer which is magneto-statically coupled to the storage layer and produces a resistance change when the data storage layer magnetization switches. A write current flows between first and second electrodes and a sensing current flows between second and third electrodes in a direction that is perpendicular to the planes of the data storage layer and data reading layer. During a write process in a certain MRAM cell, current flows only between the first and second electrodes and produces heat in the storage layer to thereby reduce the field required for switching the storage layer's magnetic state. Furthermore, the storage layer may include one or more non-magnetic insertion layers to assist heat generation by the current. In one embodiment, the switching field applied during storage layer heating is an external wide range uniform field that simultaneously influences a plurality of MRAM cells. In another embodiment, the switching field applied during storage layer heating is a localized field generated by current carrying wires embedded proximate to the MRAM cell.

In one aspect, the data reading layer is a CPP (current perpendicular to plane) sensor comprised of a free layer and a reference layer separated by an oxide layer (TMR type) or a metallic layer (GMR type) where the reference layer is exchange pinned by an AFM layer or by a SAF structure. During a read process in a MRAM cell, current flows only between the second and third electrodes and a voltage signal can be sensed between the two electrodes that indicates the resistance of the data reading layer. The data reading layer may be a patterned film element which is localized to a single MRAM cell or may be a continuous film structure that extends through an array of MRAM cells. When the data reading layer is a patterned film element, it may be aligned above the vertical center of the storage layer or may be shifted horizontally (parallel to the planes of the first and second electrodes) such that there is no overlap of the data reading layer center and storage layer center from a top-down view. In the latter case, the data reading layer senses an in-plane fringe field of an adjacent data storage layer and may sense the total fringe field of two adjacent data storage layers.

Other embodiments of the present invention involve modifications in the second electrode structure. For example, the second electrode may extend continuously over a series of MRAM cells and have a uniform thickness. Optionally, the second electrode may be a continuous layer over an array of MRAM cells but the thickness in sections between adjacent MRAM cells is at least twice the thickness of sections where the second electrode is formed between a data storage layer and a data reading layer in each MRAM cell in order to reduce serial resistance. In yet another embodiment, a second electrode is only formed within a given MRAM cell but connects with a conduction line that extends along a series of MRAM cells.

One or both of the current routing components between the third electrode and data reading layer and between the first electrode and data storage layer may be a diode wherein the current routing is controlled by the arrangement of voltage on the three electrodes. In an alternative embodiment, one or both of the current routing components may be a transistor where the current routing is controlled by a separate control line through the gate terminal of each transistor.

The present invention also encompasses a vertical MRAM structure comprised of three vertically aligned electrodes from a top-down view that separate the memory cell into two vertically aligned sections with a first section between second and third electrodes being a dedicated magnetic data reading layer and a second section between first and second electrodes being a dedicated magnetic storage layer. The second electrode has one side that abuts the data reading layer and an opposite side that abuts the data storage layer. A first diode between the data reading layer and third electrode allows a current to flow from the second electrode to the third electrode during a read process. A second diode between the data storage layer and first electrode allows a current to flow from the second electrode to the first electrode during a write process. The data storage layer is preferably comprised of a high anisotropy material whose magnetization is switched by simultaneous application of a magnetic field and thermal heating. The data reading layer is a MR device which includes at least one free layer that is magneto-statically coupled to the storage layer and produces a resistance change when the storage magnetization switches. In one aspect, the writing and reading process current flow is by voltage arrangement of the three electrodes. The switching field applied during thermal heating of the data storage layer may be a localized field generated by current carrying wires embedded proximate to the MRAM cells whereby each MRAM cell may be switched individually by a local field. Optionally, the magnetic field applied during the writing process may be a wide range field capable of acting on a plurality of MRAM cells wherein each switching process involves switching a plurality of MRAM cells to the same magnetization direction before the wide range field switches magnetization direction in the plurality of MRAM cells.

DETAILED DESCRIPTION OF THE INVENTION

The present invention is a MRAM design featuring an architecture that has separate data sensing and data storage sections to substantially reduce the half-select issue associated with conventional MRAM cells. The magnetization direction in a data storage layer is switched by a mechanism that involves an applied magnetic field with simultaneous heating of the storage layer such that the high anisotropic material therein loses anisotropy at elevated temperatures. The data storage layer produces a field on a free layer in the data reading section which rotates the FL magnetization when the data storage layer is switched. As a result, the magnetic state in the data storage layer can be determined by reading the resistance of a MR sensor containing the free layer. Various embodiments of the MRAM design are depicted that separate the electrical pathway for a write process from the electrical pathway of a read process so that the current required to heat the storage layer during a write process does not degrade the data sensing layer reliability. Note that the terms "sensing" and "reading" may be used interchangeably herein.

Figure 1:
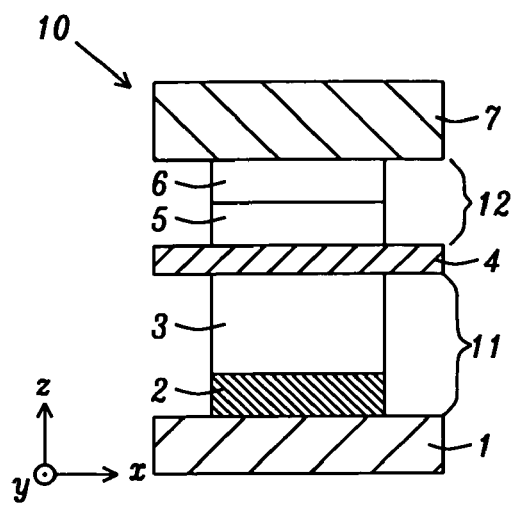
FIG. 1 is a cross-sectional view of a vertically aligned MRAM cell with a data reading layer between second and third electrodes and a data storage layer between first and second electrodes according to a first embodiment of the present invention.

Referring to FIG. 1, a MRAM structure 10 according to a first embodiment of the present invention is depicted which discloses several key features including separate data storage and data reading sections and current routing components. The MRAM cell 10 is comprised of three electrodes which are a first electrode 1, a second electrode 4, and a third electrode 7 that are aligned in a vertical configuration in a z-axis direction such that third electrode overlays a portion of the first and second electrodes from a top-down view. Each of the three electrodes, 1, 4, 7 is formed along an (x, y) plane that is perpendicular to the z-axis direction. First electrode 1 and third electrode 7 may be metal lines running along a y-axis direction, for example. Second electrode 4 may be a patterned element having an oval, circular, ring, or polygonal shape, for example, from a top-down view or may be a continuous metal line extending in an x-axis direction through a plurality of MRAM cells (not shown) as explained in a later section.

There is a dedicated data storage section 11 formed between first electrode 1 and second electrode 4 which includes a current routing component 2 adjacent to the first electrode and a magnetic data storage layer 3 that abuts a surface of second electrode which faces first electrode 1. In other words, magnetic data storage layer 3 is considered to be in closer proximity to second electrode 4 than to first electrode 1. In addition, there is a dedicated data reading section 12 formed between third electrode 7 and second electrode 4 that includes a current routing component 6 and a magnetic data reading layer 5 that abuts a surface of the second electrode opposite a surface which faces data storage layer 3. As a result, magnetic data reading layer 5 is considered to be in closer proximity to second electrode 4 than to third electrode 7. Thus, a center (second) electrode 4 separates the data storage section 11 utilized for a write process from the data reading section 12 that is relied upon for a read process.

The data reading layer 5 may be a CPP magnetoresistive (MR) sensor or junction such as a TMR or GMR type that can produce a resistance change in response to an applied magnetic field. In particular, the data reading layer 5 may be a multi-layer element with at least one free layer (not shown) whose magnetic moment can be rotated by applying a magnetic field of sufficient magnitude. The present invention encompasses MR sensors with a variety of configurations that are known as bottom spin valve, top spin valve, and dual spin valve by those skilled in the art. For example, the data reading layer 5 may be a CPP sensor comprised of a free layer and a reference layer separated by an oxide layer or metallic layer wherein the reference layer is exchange pinned by an AFM layer or by a synthetic anti-ferromagnetic structure.

Current routing component 2 allows a current from second electrode 4 to flow only through storage layer 3 to first electrode 1 while current routing component 6 allows a current from second electrode 4 to flow only through data reading layer 5 into third electrode 7. In other words, at any given moment, a current may be directed either through the data storage section 11 or through the data reading section 12 while avoiding a condition where the same current flows through both sections 11, 12 simultaneously. This capability to selectively route a current through individual sections (11 or 12) of MRAM cell 10 is advantageous because a "write" current required to heat (and switch) the data storage layer 3 in data storage section 11 is typically significantly larger than a current needed to "read" a MR sensor in the data reading section 12 which means the larger "write" current could easily damage a junction in data reading layer 5 in the absence of selective routing.

Figure 2A:
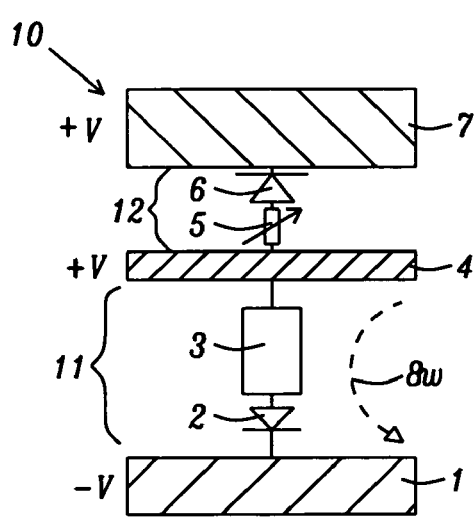
FIG. 2a is a cross-sectional view of the MRAM structure in FIG. 1 where a diode is formed between the first electrode and data storage layer and the current flow from the second electrode to first electrode illustrates a thermally assisted write process.
Figure 2B:
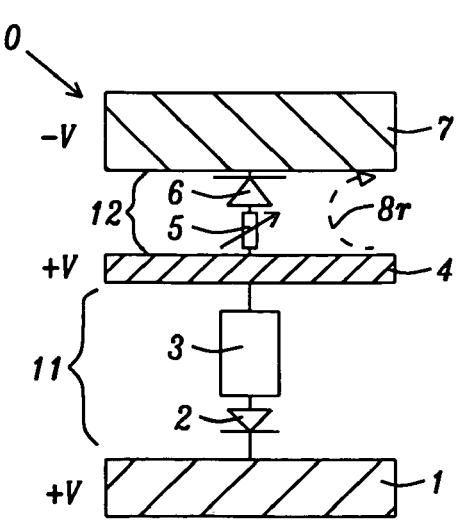
FIG. 2b is a cross-sectional view of the MRAM structure in FIG. 1 where a diode is formed between the third electrode and data reading layer and the current flow from the second electrode to third electrode illustrates a read process.

In one embodiment, one or both current routing components 2, 6 may be a diode where the current routing is controlled by the arrangement of the voltage on the three electrodes 1, 4, 7. As shown in FIG. 2a, by keeping the third electrode 7 and second electrode 4 at the same voltage (+V) and setting the first electrode 1 at a lower (−V) voltage, current 8w is blocked from passing through data reading section 12 and flows only through data storage section 11 as in a write process. On the other hand, by keeping the second electrode 4 and first electrode 1 at the same (+V) voltage (FIG. 2b) and setting the third electrode 7 at a (−V) voltage, current 8r flows only through data reading section 12 as in a read process. In another aspect, one or both of the current routing components 2, 6 may be a transistor where the current routing is controlled by a separate control line through the gate terminal (not shown) of the transistor. Note that both currents 8w, 8r flow in a z-axis direction perpendicular to the x,y planes of the three electrodes 1, 4, 7.

Data storage layer 3 is preferably comprised of a high anisotropic material whose anisotropy decreases with increasing temperature. A typical heating event during a write process will heat the data storage layer 3 to a range of 200° C. to 300° C. within sub-microseconds. In one aspect, the data storage layer 3 is made of a hard magnetic material with anisotropy determined by crystalline structures and is a composite with at least two elements including but not limited to Fe, Co, Mn, Pd, Cr, Pt, B, N, Si, and O comprising at least one metal from the aforementioned elements. In another aspect, the high anisotropic material may be a hard magnetic material used as the recording medium in a hard disk drive such as a multi-layer super-lattice structure having a high intrinsic vertical (perpendicular) anisotropy as found in Co/Pd or Co/Pt multi-layers, for example. Preferably, the super-lattice structure is comprised of a plurality of repeating magnetic/non-magnetic layers arranged in a laminated configuration where a magnetic layer may be one or more of Fe and Co, and a non-magnetic layer may be one or more of Pt and Pd.

In another embodiment, the data storage layer 3 may be comprised of a laminate of at least two magnetic films having different composition such as $(Co/Ni)_n$ where $n \geq 1$.

In yet another embodiment, the data storage layer 3 may be a multi-layer structure comprised of interlacing (laminating) a plurality of FM layers and a plurality of AFM layers in an alternating fashion such as $(FM/AFM)_n$ where $n \geq 1$ and in which the AFM layers pin the FM layers through exchange coupling. In this embodiment, each of the plurality of AFM layers undergoes a phase change to a non-AFM phase during heating thereby allowing a switch in magnetization direction of data storage layer 3 to occur when a magnetic field of sufficient magnitude is applied during a period of heating and then cooling. Note that the cooling process occurs within a matter of microseconds since the heat from a data storage layer 3 with a diameter of around 100 nm from a top-down view dissipates rapidly into a large mass represented by a surrounding insulation layer (not shown). The applied switching field remains on during the cooling process to prevent the magnetization from switching away from the desired state.

A key feature of the data storage layer 3 is that the product of its magnetic moment and thickness, i.e. Mrt, should be large enough to produce a magnetic field in the data reading layer 5 and induce a resistance change therein. To achieve this requirement, the thickness of the data storage layer 3 should be about 0.5 to 5 times the thickness of the second electrode 4. Therefore, when the data storage layer 3 is switched by a combination of heating and an applied magnetic field, the resulting magnetic moment in the data storage layer will cause the magnetization direction in the at least one free layer within the data reading layer 5 to rotate. After the magnetization in data storage layer 3 is switched by simultaneously heating and applying a magnetic field, the heating current between the second electrode 4 and third electrode 1 is turned off. During the cooling of storage layer 3, the magnetic field is still applied and magnetization remains in the switched direction.

In an alternative embodiment, the data storage layer 3 may have one or more layers of a non-magnetic thin film inserted therein to increase resistance and thereby assist in heat generation when a write current is applied. The one or more non-magnetic insertion layers (not shown) may be made of one or more elements including but not limited to Ta, Ti, Ni, W, Cr, Al, Cu, Ru, Si, C, O, and N.

Switching of the data storage layer 3 is assisted by current heating as mentioned previously. At a certain elevated temperature that is preferably above normal ambient conditions, the switching field of the data storage layer 3 will decrease either due to an anisotropy decrease when comprised of a hard magnetic material or as a result of an AFM layer phase change to a non-AFM phase in a FM/AFM sandwich configuration. In a state where there is a reduced switching field, an external field applied to the MRAM cell while the storage layer 3 is heated and cooled down is able to switch the magnetization of the storage layer to the direction of the applied field. It should be understood that there are a plurality of MRAM cells in a MRAM array (1 million in a 1 Mb design) and only the cells that are heated are switched during a write process.

Typically, a plurality of MRAM cells is not heated during a write process of the present invention and those cells are not affected by the applied field. The applied field may be a wide range uniform field applied externally to the MRAM structure wherein the applied field may infringe on a plurality of MRAM cells simultaneously. Preferably, the plurality of MRAM cells are first switched to the same magnetization direction before the wide range magnetic field is applied to switch (reverse) magnetization, again. Alternatively, the applied field may be a localized field generated by current carrying electrical wires embedded in an insulation layer proximate to the MRAM cell such as bit lines and word lines employed in conventional switching of MRAM cells.

As a result of the write process that switches magnetization of the data storage layer 3, a reversed magneto-static field is produced in the data reading layer 5. The magnetization state of the data storage layer 3 is determined by reading the resistance of the data reading layer 5. It should be understood that the voltage level between third electrode 7 and second electrode 4 reflects the resistance of the data reading layer 5 during a read process when a current flows between the second and third electrodes.

By incorporating current routing control components 2, 6 between the first electrode and second electrode and between second electrode and third electrode, respectively, data storage layer 3 and data reading layer 5 can be operated independently so that high current density required during heating of the data storage layer will not adversely affect the quality of the MR junction in the data reading layer. The MRAM design disclosed herein thereby avoids limitations in prior art MRAM designs based on heat assisted switching that rely on current flowing through the MR junction to also heat the data storage layer. Moreover, data storage layer 3 and data reading layer 5 can be optimized individually so that a structure modification improvement in data storage section 11 does not adversely affect performance in the data reading section 12, and vice versa. Preferably, data storage layer 3 is a patterned hard magnetic layer that can provide a magnetic field to the data reading layer 5 and can be easily switched at low magnetic field at elevated temperature. Desired properties in the data reading layer 5 are low noise (high SNR) and a high sensitivity MR sensor that produces a high enough signal to be measured when the field from data storage layer 3 switches direction.

According to one aspect of the present invention, the data reading layer 5 in each MRAM cell 10 is a patterned element in the form of an oval, circle, ring, or a polygonal shape from a top-down view. Preferably, the data reading layer 5 is aligned above the center of the data storage layer 3 from a top-down view (not shown) along the z-axis. Data reading layer 5 in MRAM cell 10 is unique to that cell and is not shared by any adjacent MRAM cells in the MRAM array (not shown). In effect, the role of the data reading layer 5 in MRAM cell 10 is similar to the role of the read head in a hard disk drive. By eliminating the need for switching of a free layer which is affected by anisotropy and exchange fields related to patterned sensor shape or coupling from a reference layer that typically broaden switching field distribution, the criteria for controlling MR sensor (and free layer) shape and size is less stringent in the present invention. Thus, the MRAM structure (i.e. MRAM cell 10) of the present invention, which operates by a mechanism whereby the free layer in data reading layer 5 is rotated by a field from data storage layer 3, enables more flexibility in MRAM design and minimizes switching field distribution compared to a conventional MRAM cell.

A separate reference layer structure has been disclosed by Min et al. in U.S. Patent Application Publication 2007/0189064 which shares one similarity with the present invention in that a heated reference structure is separated from a sensing structure. However, the prior art does not show a vertically integrated MRAM cell design as in the present invention and focuses primarily on a heated switching structure comprised of one AFM layer coupled to one FM layer which is not considered applicable to the MRAM design described herein since Min's reference layer is not capable of generating sufficient field strength in the data reading layer of a vertically integrated MRAM cell. The present invention overcomes this limitation by incorporating a data storage layer made of hard magnetic material or a multi-layer AFM/FM structure that produces sufficient field in an overlying data sensing layer to cause a magnetization rotation when the data storage layer magnetization switches.

In U.S. Pat. No. 7,009,877, a three terminal MRAM design with separate storage and sensing layers is disclosed. However, this prior art structure relies on spin-torque switching of the storage layer which basically limits the storage layer thickness because the spin-torque effect decreases inversely with switching layer thickness. To assure 100% switching by a spin-torque effect from the storage layer, the Mrt product cannot be large for practical reasons which ultimately limits the field magnitude that can be generated in a sensing layer on an opposite side of an electrode with respect to the storage layer. As mentioned previously, the data storage layer in the present invention is switched by a realizable magnetic field and is assisted by heat generated from current flowing through the data storage layer which physically does not impose a limit on data storage layer thickness. As a result, the field produced by the data storage layer in the data reading layer can be increased by selecting a larger data storage layer thickness.

In another embodiment according to the present invention, the MRAM design as depicted in FIG. 1 may be integrated with a simple diode structure as similarly employed in advanced Phase-change Random-Access-Memory (PRAM) and has the potential to reach state of the art solid state storage density performance with magnetic data storage benefits such as long life-time and a non-volatile state. A PRAM example is described in U.S. Patent Application Publication 2007/0184613. PRAM is also included in prior art associated with magnetic memory in U.S. Pat. Nos. 7,180,770 and in 5,640,343.

Figure 3A:
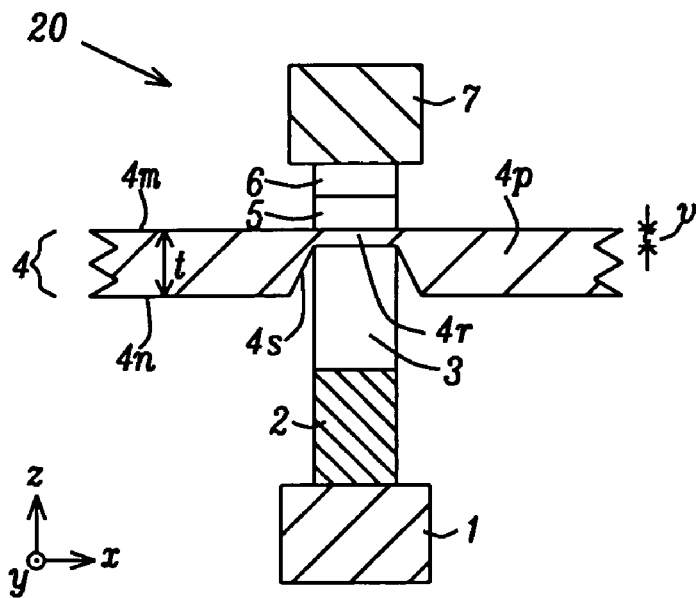
FIG. 3a is a cross-sectional view of a MRAM cell where a section of the second electrode is thinner between a data storage layer and data reading layer than sections formed between adjacent MRAM cells according to one embodiment of the present invention.

With regard to FIG. 3a, a variation of the first embodiment (FIG. 1) of the present invention is shown wherein the second electrode 4 is part of a continuous word line or continuous bit line that extends through a plurality of MRAM cells including a MRAM cell 20. Generally, the second electrode 4 as depicted in FIG. 1 is preferably thin in order to minimize the distance between the data storage layer 3 and data reading layer 5 and thereby avoid depleting the field exerted by the data storage layer in the data reading layer. However, when second electrode 4 is part of a continuous word line or bit line during a read back operation, a thin electrode layer will introduce a significant amount of serial resistance as the line extends a substantial distance away from MRAM cell 20. This limitation is overcome by a design depicted in FIG. 3a where the second electrode has a section 4r having a thickness v between data storage layer 3 and data reading layer 5 and has sections 4p having a thickness t formed in regions not located between a data storage layer and a data reading layer. An important feature is that thickness t is significantly greater than thickness v such that t is preferably at least 2× larger than v.

In one embodiment, the top surface 4m of second electrode 4 is planar and is comprised of a top surface from each section 4p and from each section 4r. The bottom surfaces 4n of each section 4p do not form a continuous planar surface comprised of a plurality of sections 4r. In other words, adjacent sections 4p are separated by a section 4r and by a portion of storage layer 3. Preferably, a sidewall 4s of section 4p that faces a side of storage layer 3 is separated from the storage layer and may have either a vertical orientation along the z-axis direction or a sloped orientation with respect to the z-axis as depicted in the exemplary embodiment.

Figure 3B:
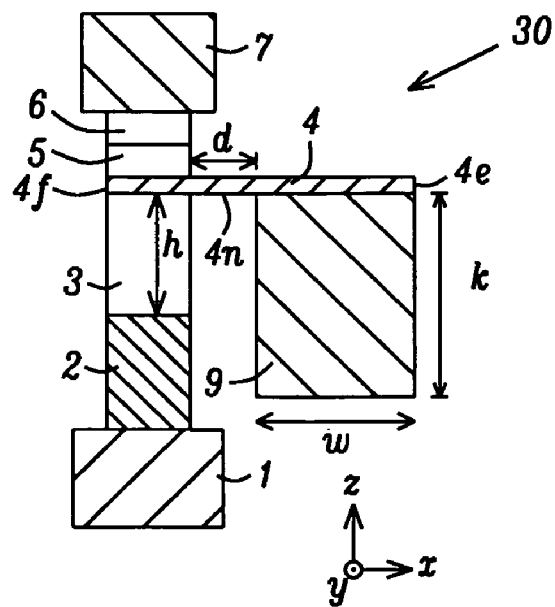
FIG. 3b is a cross-sectional view of a MRAM cell where a second electrode has a uniform thickness but connects with a separate thick conduction line running along a series of MRAM cells according to an embodiment of the present invention.

In FIG. 3b, another embodiment of the present invention is shown that represents a modification of the MRAM design depicted in FIG. 1. In particular, the MRAM cell 30 has a thin second electrode 4 with uniform thickness and is a patterned element which extends a certain distance in one direction along the x-axis, for example, and terminates at an end 4e. The other end 4f of second electrode 4 along the x-axis may be coplanar with a side of data storage layer 3 and data reading layer 5. In this embodiment, serial resistance in the thin second electrode 4 is reduced to an acceptable level by connecting the bottom surface 4n of second electrode 4 to a thick conduction line 9 having a thickness k. Although thickness k is shown greater than the thickness h of data storage layer 3, k may also be less than h in an alternative embodiment. The thick conduction line 9 has a width w and is preferably connected to either the top surface 4m or to the bottom surface 4n at a distance d from the nearest side of the data storage layer 3. Conduction line 9 runs along a y-axis direction and may be connected to a second electrode in a plurality of other MRAM cells (not shown) in the MRAM array.

The present invention also encompasses an embodiment wherein the second electrode 4 is a continuous element that is connected to a conduction line (not shown). For example, a plurality of second electrodes 4 may be formed in a parallel configuration with a lengthwise dimension along the x-axis and each connect at one end to a conduction line running along a y-axis.

Figure 4:
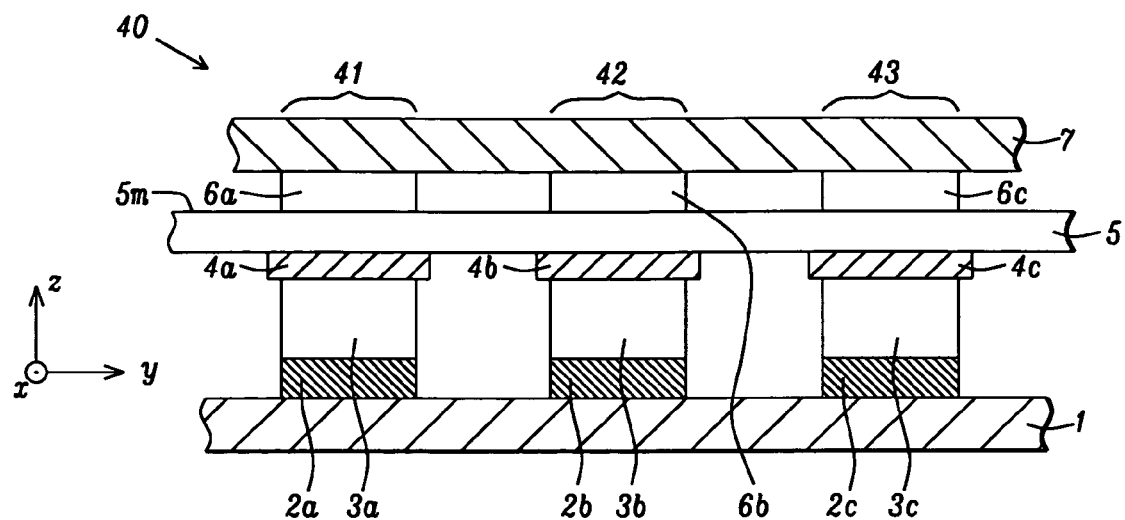
FIG. 4 is a cross-sectional view of a continuous data reading layer that is shared by a plurality of MRAM cells according to a second embodiment of the present invention.

With regard to FIG. 4, a second embodiment of the present invention is illustrated which represents a modification of the MRAM cell shown in FIG. 1 wherein the data reading layer 5 or MR sensor may be a continuous element that extends through a plurality of MRAM cells along a certain axis. Note that the view of MRAM structure 40 which includes MRAM cells 41, 42, 43 is rotated 90 degrees with respect to the diagram in FIG. 1 such that the x-axis is protruding from the plane of the paper and the y-axis runs along the plane of the paper in order to clearly point out the continuous form of data reading layer 5. It should be understood that there are a plurality of additional MRAM cells comprised of data reading layer 5 in MRAM structure 40 that are not shown in order to simplify the drawing. First electrode 1 and third electrode 7 are lines running in the y-axis direction parallel to the data reading layer 5 and form crossing points with second electrode lines 4a, 4b, 4c at various MRAM cell locations.

Each MRAM cell has separate elements for (a) the current routing component between first electrode 1 and a second electrode, (b) a data storage layer, and (c) a current routing component between a second electrode and third electrode 7. Moreover, there is a different second electrode for each MRAM cell in MRAM structure 40. For example, MRAM cell 41 includes a current routing component 2a, a data storage layer 3a, a second electrode 4a, a portion of data reading layer 5, and a current routing component 6a arranged in a vertical stack along the z-axis between first electrode 1 and third electrode 7. Thus, MRAM cells 41, 42, 43 include a portion of the same data reading layer 5 but the data storage layers 3a, 3b, 3c, respectively, are physically separated.

During a read operation that selectively reads a certain MRAM cell such as cell 41, for example, the cross point of third electrode 7 and a second electrode 4a at the location of a given storage pattern (data storage layer 3a) will tap the MR sensor resistance in the overlying portion of data reading layer 5 between second electrode 4a and current routing component 6a. Due to the high in-plane resistance of data reading layer 5, the tapped resistance is similar to the case in FIG. 1 where data reading layer is patterned into an oval, circular, or polygonal shape in each MRAM cell. In the embodiment illustrated in FIG. 4, magnetization of storage layer 3a is expected to be switched in an x-axis direction and free layer magnetization in data reading layer 5 is expected to be along the y-axis direction and only rotates into the x-axis direction above the storage layer site between second electrode 4a and current routing component 6a. In other words, the resistance in a certain MRAM cell within a plurality of MRAM cells comprising the continuous data reading layer 5 is determined with a current flowing between the second and third electrodes within the certain MRAM cell so that a voltage signal between said second and third electrodes reflects the local resistance in a portion of the continuous reading layer formed between the second and third electrodes.

Advantages provided by the MRAM structure 40 in FIG. 4 are the following. First, a data reading layer in the form of a continuous line (stripe from a top-down view) requires less patterning than islands in the shape of ovals or circles (FIG. 1) and thereby has less shape anisotropy variation to affect free layer rotation which is equivalent to a smaller switching field distribution. Secondly, free layer magnetization rotates only at the selected MRAM cell location and is exchange pinned by the continuous data reading layer between the selected cell and adjacent MRAM cells. Therefore, the free layer has no edge charge induced 1/f type of mag-noise at sub-100 nm MRAM cell sizes generally required in advanced devices. Thirdly, the continuous free layer within the data reading layer 5 leads to smaller neighbor-neighbor sensitivity variation between MRAM cells than in MRAM arrays having individual island shaped data reading layers for each MRAM cell. A semi-continuous read back along the continuous data reading layer 5 relieves the need for a reference sensor.

When considering the use of a hard magnetic material as the data storage layer 3, it should be understood that both longitudinal and perpendicular anisotropy recording materials can be employed and both have been extensively studied in the magnetic recording technology applications. Longitudinal magnetic recording (LMR) has in-plane random anisotropy and perpendicular magnetic recording (PMR) material has vertical anisotropy and is much better controlled by epitaxial growth of the lattice structure. An additional benefit of PMR is that each storage structure can be much larger in height than its in-plane dimension thereby helping to reduce a field cancellation effect by opposite charges in small size MRAM cells at high data densities.

The only draw back with utilizing a PMR material in data storage layer 3 is that in a vertically aligned structure as in FIG. 1, the field produced by the data storage layer is vertical in the data reading layer 5 and cannot be sensed by MR sensors with an in-plane free layer moment. To resolve this issue, the MRAM structure in FIG. 1 may be modified by shifting the data reading section 12 between two adjacent data storage sections 11. Therefore, the present invention anticipates one or more embodiments wherein the data reading section 12 including data reading layer 5 (MR sensor) and current routing component 6 is shifted off-axis with respect to the vertical aligned stack comprised of a first electrode 1, second electrode 4, and data storage section 11 such that the center of the data reading layer 5 is not aligned over the center of the data storage layer 3 from a z-axis perspective.

Figure 5A:
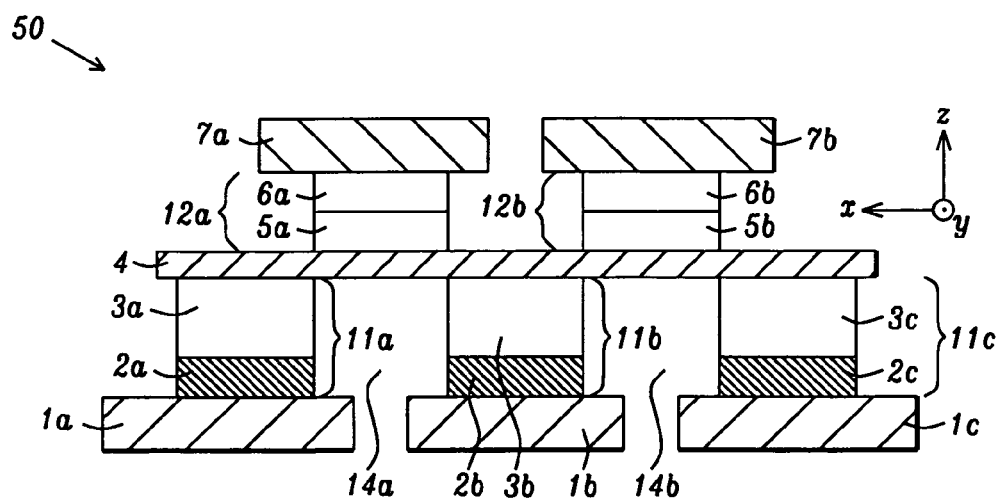
FIG. 5a is a cross-sectional view of a MRAM design where the data reading section is shifted in the x-axis direction with respect to the data storage section so that the data reading and data storage layers do not overlap from a top-down (z-axis) perspective according to a third embodiment of the present invention.

In a third embodiment shown in FIG. 5a, each of the data reading sections 12a, 12b and overlying third electrodes 7a, 7b, respectively, in MRAM structure 50 are shifted in an x-axis direction with respect to the data storage sections 11a, 11b, 11c and underlying first electrodes 1a, 1b, 1c, respectively. The second electrode 4 is shown as a continuous line with uniform thickness along the x-axis direction and extends through a plurality of MRAM cells. Second electrode 4 is contacted on one side by data reading layers 5a, 5b and on an opposite side by data storage layers 3a, 3b, 3c. As a result, data reading section 12a is aligned above an opening 14a between data storage sections 11a, 11b and data reading section 12b is aligned above an opening 14b between data storage sections 11b, 11c. Therefore, when PMR magnetization of adjacent storage layers 3a, 3b are in different (opposite) directions, they produce a net in-plane field in data reading layer 5a and rotate the free layer within, accordingly. When PMR magnetization of storage layers 3a, 3b are in the same direction and identical, the total field applied to data reading layer 5a is approximately 0 and the free layer magnetization within stays unchanged. In this design, the data reading layers 3a, 3b preferably have an anisotropy along the y-axis direction and only rotate into the x-axis direction in the presence of an x-axis field produced by adjacent data storage layers 5a, 5b or 5b, 5c, respectively.

The embodiment depicted in FIG. 5a also encompasses a design wherein the data storage layers 3a, 3b, 3c are made of a LMR material rather than a PMR material. In this case, when magnetization of data storage layers such as 3a, 3b are in opposite directions, preferably along the x-axis, there is essentially no field produced at the data reading layer 5a. On the other hand, when magnetization of data storage layers 3a, 3b are in the same direction, a net in-plane field is produced in data reading layer 5a and the free layer within rotates.

In one aspect where the widths of the data storage sections 12a, 12b are substantially smaller than the widths of the openings 14a, 14b in an x-axis direction, the free layer within each data reading layer 5a, 5b may detect a fringe field generated by a nearby data storage layer 3a or 3b. Thus, only one data storage layer may influence a free layer in each data reading layer. This embodiment relates to a lower density MRAM structure than in the first embodiment representing a vertically aligned MRAM. The MRAM structure in FIG. 5a may have a benefit over a modification wherein a data reading layer is substantially smaller than the underlying space between two data storage sections because the effective field on a given data reading layer is enhanced by the combined field from two adjacent data storage layers. A high density MRAM design in the present embodiment has an advantage of an inherent error correction mechanism if the data reading layers (MR sensors) are read in serial.

Figure 5B:
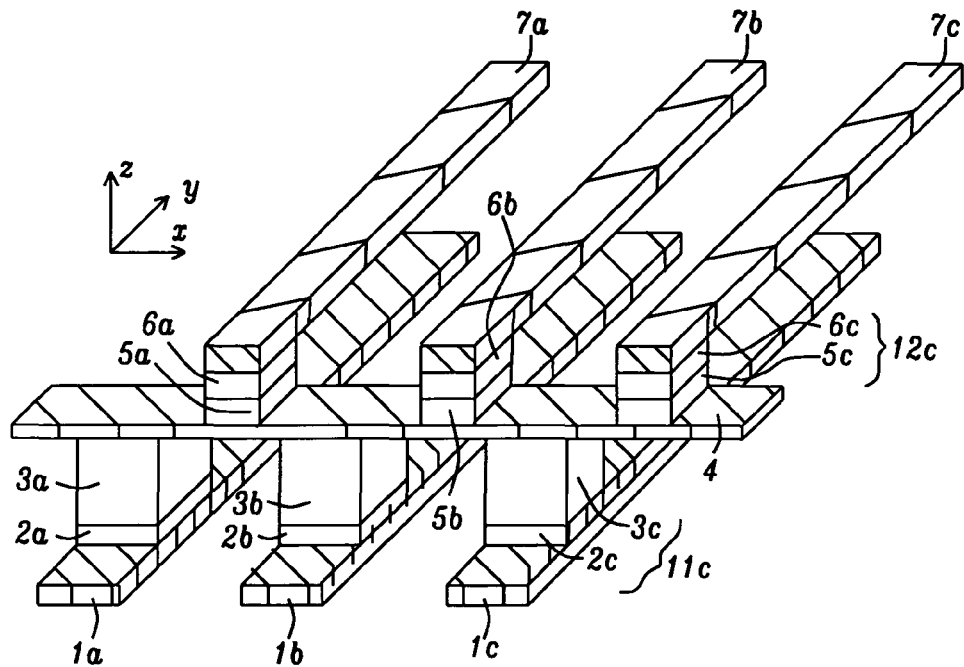
FIG. 5b is an oblique view of the third embodiment of the present invention where each data reading layer is patterned between first and second electrodes.

In FIG. 5b, a three dimensional (oblique) view of an MRAM structure according to the third embodiment is shown which is similar to FIG. 5a except there is an additional data reading section 12c comprised of data reading layer 5c and overlying current routing component 6c included in the upper right portion of the drawing. Also, the width of data reading sections are shown having a smaller width (less than the spacing between adjacent data storage layers) compared to the MRAM structure in FIG. 5a. As indicated earlier, the third embodiment encompasses MRAM structures wherein the width of the data reading sections is equal to or less than the width of the underlying opening between adjacent data storage sections. Note that first electrodes 1a, 1b, 1c and third electrodes 7a, 7b, 7c are continuous lines running in a y-axis direction. Each of the current routing components, data storage layers, and data reading layers forms a patterned shape in the (x, y) plane. Therefore, each data storage section such as section 11c forms a pillar between a first electrode and a second electrode, and each data reading section such as section 12c forms a pillar between a second electrode and a third electrode. The shape of a data storage section pillar may be different than the shape of a data reading section pillar from a top-down view along the z-axis.

Figure 6:
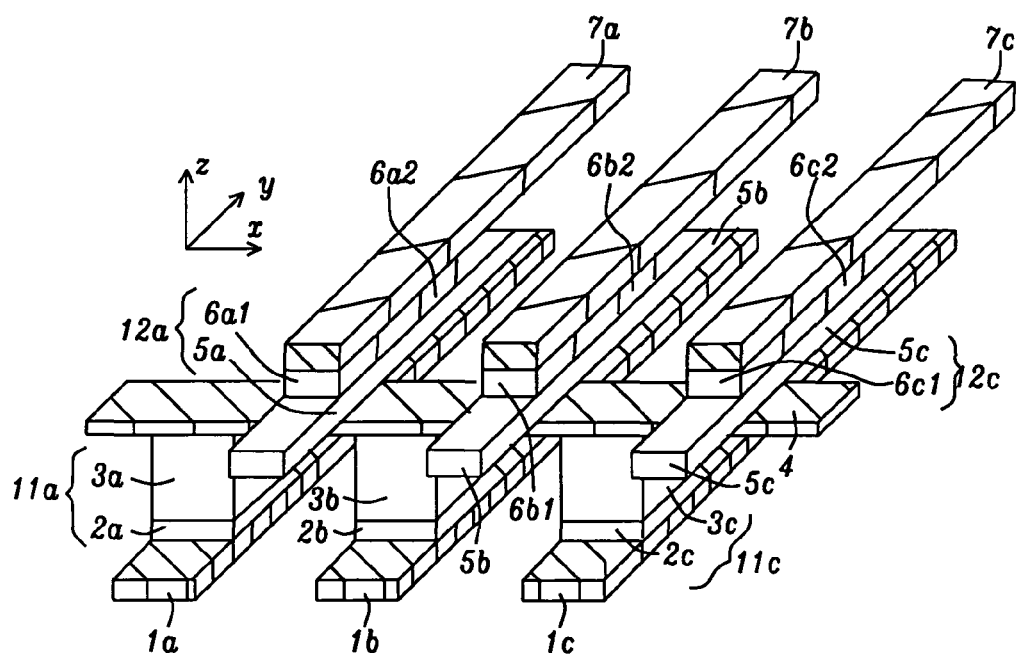
FIG. 6 is an oblique view of a fourth embodiment of the present invention where the data sensing layer is continuous and is shifted in an x-axis direction such that each data reading section is formed between two adjacent data storage sections from a top-down view along the z-axis.

In FIG. 6, a fourth embodiment of the present invention is depicted that combines certain features from both the second and third embodiments. For example, the fourth embodiment includes a continuous data reading layer as previously discussed with regard to the second embodiment (FIG. 4) and a shift of each of the plurality of data reading sections from a position directly above a data storage section to a position intermediate between two adjacent data storage sections as in the third embodiment. The continuous data reading layers 5a, 5b, 5c run along the y-axis direction and are parallel to overlying third electrode layers 7a, 7b, 7c, respectively. Similar to FIG. 5b, the plurality of data reading sections 12a, 12b, 12c, and others not shown are shifted in an x-axis direction with respect to the plurality of data storage sections 11a, 11b, 11c, etc. It should be understood that there is also a plurality of second electrodes arranged in a parallel pattern but only second electrode 4 is shown to simplify the drawing. For example, another second electrode (not shown) is positioned below current routing components 6a, 6b, 6c and runs along the x-axis direction while contacting a bottom surface of data reading layers 5a, 5b, 5c. Depending on the distance between adjacent MRAM cells, the width of data reading layers 5a, 5b, 5c, and the overlay of the data reading layer pattern on the storage layer line pattern, the MR sensor within each data reading layer may sense only the fringe field from a single data storage layer or the combined fringe field from two neighboring data storage layers.

Modifications of the second electrode 4 as depicted in FIGS. 3a, 3b with regard to lowering serial resistance in the second electrode may be incorporated in each of the aforementioned four embodiments where a continuous second electrode runs through a series of MRAM cells in a MRAM array. A second electrode with variable thickness also helps to enhance the field from the data storage layer onto the data reading layer.

In summary, there are several benefits of the heat assisted switching and separated read-write MRAM design disclosed herein. First, heat assisted switching of the hard magnetic material in a separate data storage layer reduces switching field distribution and half select effects that limit conventional MRAMs. Secondly, separated reading and writing structures enable independent optimization of data storage and data sensing layers and current routing through separate storage and reading sections so that a large heating current in the data storage layer does not adversely impact the MR sensor in the data reading layer. Thirdly, the data storage layer has flexibility in being made of either optimum thickness high anisotropy material (PMR or LMR) or multi-layer material in an alternating AFM/FM configuration to produce sufficient field in the data reading layer and maintain a stable data-retaining state. A fourth advantage is reading of the stored magnetic state is accomplished by a high sensitivity MR sensor based on free layer magnetization rotation instead of switching and thereby imposes less stringent requirements on MR sensor design. A fifth benefit is that a vertically integrated MRAM cell structure including diodes for current routing as depicted in the first and second embodiments enables a single pillar MRAM cell for high density data storage.

The present invention also encompasses a method of making a vertically integrated MRAM cell such as depicted in FIG. 1 with separated read-write functions and thermally assisted switching. In one embodiment, a first electrode 1 may be formed in an array of first electrode wires on a substrate and formed coplanar with a first insulation layer (not shown). First insulation layer separates adjacent first electrode wires in a MRAM array to be comprised of a plurality of MRAM cells at the end of the fabrication sequence. A first electrode 1 may be a wire with a length along a first axis (y-axis), a width along a second axis (x-axis), and a thickness in a certain direction (z-axis) perpendicular to the x-axis and y-axis. Next, a stack including a lower first routing component layer 2 comprised of a first diode material or composite, and an upper data storage layer 3 may be formed on the first electrode 1 (and other first electrodes in the array) and on the first insulation layer. The first diode layer 2 and data storage layer 3 may be simultaneously patterned to form a data storage section 11 at each location on a first electrode 1 where a MRAM cell is to be positioned.

The data storage layer 3 is a material or composite with high anisotropy as described previously that loses anisotropy at elevated temperatures thereby allowing an applied magnetic field to switch the data storage layer's magnetization direction. The applied switching field may be a localized field generated by current carrying wires embedded proximate to each of the plurality of MRAM cells, and each of the plurality of MRAM cells may be switched individually by a localized field. Optionally, the applied switching field may be a wide range field that impinges on the plurality of MRAM cells. Each of the plurality of MRAM cells is preferably switched to the same magnetization direction before withdrawing or reversing the wide range field.

Returning to the MRAM cell fabrication sequence, a second insulation layer (not shown) may be deposited and planarized to separate data storage sections in adjacent MRAM cells. Thereafter, a second electrode layer may be deposited and patterned to form a second electrode element 4 above the first electrode 1 in each MRAM cell. A data reading section 12 is then formed on the second electrode at each MRAM cell location by depositing a stack comprised of a lower data reading layer and an upper second diode layer, for example, followed by a patterning process to define a data reading layer 5 and second diode 6 in a certain shape such as an oval, circle, or polygon above each second electrode. The data storage layer 3 has an upper surface that preferably contacts a lower side of a second electrode 4 while the data reading layer 5 has a lower surface which contacts a side of the second electrode opposite that of the data storage layer in each MRAM cell. Another insulation layer (not shown) may be deposited and planarized to separate data reading sections in adjacent MRAM cells. Finally, a third electrode layer is deposited on the second diode and surrounding insulation layer and is then patterned to form an array of third electrode wires such that a third electrode wire 7 crosses over a stack comprised of a first electrode 1, data storage section 11, second electrode 4, and data reading section 12 in each of the plurality of MRAM cells. Preferably, the third electrode 7 has a length along the y-axis direction, a width along an x-axis direction, and a thickness in a z-axis direction.

A method for selectively writing to a certain cell with a first current that avoids flowing through a data reading section was described earlier. Likewise, a method for selectively reading a certain cell with a second current that only passes from the second electrode to a third electrode was disclosed previously.

While this invention has been particularly shown and described with reference to, the preferred embodiment thereof, it will be understood by those skilled in the art that various changes in form and details may be made without departing from the spirit and scope of this invention.

I claim:

1. A magnetic random access memory (MRAM) structure comprised of a plurality of MRAM cells wherein each MRAM cell comprises:
   (a) three electrodes including a first electrode, a third electrode, and a second (center) electrode that separates said MRAM cell into two sections which are a dedicated magnetic data storage section and a dedicated magnetic data reading section wherein the first electrode, the magnetic data storage section, and the second electrode form a stack of layers that are aligned in a certain direction and each of the three electrodes are formed along a plane perpendicular to said certain direction;
   (b) a dedicated magnetic data storage section formed between the first electrode and the second electrode, comprising:
      (1) a magnetic data storage layer formed along a plane perpendicular to said certain direction and contacting a side of the second electrode that faces the first electrode, said magnetic data storage layer is comprised of a high anisotropy material with a magnetization that is switched by simultaneously applying a magnetic field and thermal heating; and
      (2) a first current routing component formed between the magnetic data storage layer and the first electrode that allows a write current to flow only through the magnetic data storage layer between the second electrode and the first electrode in a direction perpendicular to the planes of said first and second electrodes and magnetic data storage layer during a write process;
   (c) a dedicated magnetic data reading section formed between the second electrode and the third electrode, comprising:
      (1) a magnetic data reading layer formed along a plane perpendicular to said certain direction and contacting a side of the second electrode opposite the magnetic data storage layer, said magnetic data reading layer is comprised of a magnetoresistive (MR) device having at least one free layer that is magneto-statically coupled to said magnetic data storage layer and produces a resistance change when the data storage layer magnetization switches; and
      (2) a second current routing component formed between the magnetic data reading layer and the third electrode that allows a sensing current to flow only through the magnetic data reading layer between the second electrode and the third electrode in a direction perpendicular to the planes of said second and third electrodes and magnetic data reading layer during a read (sensing) process.

2. The MRAM structure of claim 1 wherein the said magnetic data storage layer is comprised of hard magnetic material with anisotropy determined by crystalline structures and wherein said anisotropy decreases with increasing temperature.

3. The MRAM structure of claim 1 wherein said magnetic data storage layer is comprised of a super-lattice structure having a high perpendicular anisotropy from the super-lattice structure, said perpendicular anisotropy decreases with increasing temperature.

4. The MRAM structure of claim 1 wherein the magnetic data storage layer is comprised of a multi-layer structure that is formed by interlacing (laminating) a plurality of anti-ferromagnetic (AFM) layers and a plurality of ferromagnetic (FM) layers in a $(FM/AFM)_n$ or $(AFM/FM)_n$ configuration where n is $\geq 1$.

5. The MRAM structure of claim 2 wherein the hard magnetic material is a composite of at least two elements selected from Fe, Co, Mn, Pd, Cr, Pt, B, N, Si, and O comprising at least one metal from the aforementioned elements.

6. The MRAM structure of claim 3 wherein the super-lattice structure is comprised of a plurality of repeating magnetic/non-magnetic layers arranged in a laminated configuration where the magnetic layer may be one or more of Fe and Co, and the non-magnetic layer may be one or more of Pt and Pd.

7. The MRAM structure of claim 3 wherein the superlattice structure is comprised of a laminate of at least two magnetic films having different composition as in $(Co/Ni)_n$ where $n \geq 1$.

8. The MRAM structure of claim 4 wherein the plurality of AFM layers pin said FM layers through exchange coupling and said plurality of AFM layers undergoes a phase change to a non-AFM phase during heating.

9. The MRAM structure of claim 1 wherein a current flows only between a second electrode and a first electrode during a writing process in a certain cell of the plurality of MRAM cells and thereby reduces the switching field in the data storage layer formed between said second electrode and first electrode.

10. The MRAM structure of claim 1 wherein the thickness of said data storage layer is between about 0.5 to 5 times the thickness of said second electrode.

11. The MRAM structure of claim 1 wherein said data storage layer comprises one or more non-magnetic insertion layers to assist in heat generation during a write process, said one or more non-magnetic insertion layers are comprised of one or more of Ta, Ti, Ni, W, Cr, Al, Cu, Ru, Si, C, O, and N.

12. The MRAM structure of claim 1 wherein said data storage layer is switched during a write process by heating said data storage layer and applying a field which is a wide range uniform field that infringes upon a plurality of MRAM cells simultaneously.

13. The MRAM structure of claim 1 wherein said data storage layer is switched during a write process by heating said data storage layer and applying a field that is a local field generated by current carrying electrical wires proximate to the MRAM cell.

14. The MRAM structure of claim 1 wherein the data reading layer is a perpendicular-to-plane (CPP) sensor comprised of a free layer and a reference layer separated by an oxide layer or a metallic layer wherein the reference layer is exchange pinned by an AFM layer or by a synthetic AFM structure.

15. The MRAM structure of claim 1 wherein the data reading layer in a certain MRAM cell is sensed during a read process with a current flowing only between said second and third electrodes within said MRAM cell and reading a voltage signal between said second and third electrodes that reflects the resistance of the data reading layer therebetween.

16. The MRAM structure of claim 1 wherein the data reading layer in each of the plurality of MRAM cells is a patterned element that has an oval, circular, ring, or a polygonal shape from a top-down view.

17. The MRAM structure of claim 1 wherein said data reading layer is a continuous film element that extends through a plurality of MRAM cells along a certain axis.

18. The MRAM structure of claim 17 wherein the resistance in a certain MRAM cell within said plurality of MRAM cells is determined with a current flowing between the second and third electrodes within said certain MRAM cell so that a voltage signal between said second and third electrodes reflects the local resistance in a portion of the continuous reading layer formed between the second and third electrodes.

19. The MRAM structure of claim 1 wherein the data reading layer is aligned vertically above a center of the data storage layer from a top-down view perpendicular to the planes of said data storage and data reading layers.

20. The MRAM structure of claim 1 wherein said data reading layer in each of the plurality of MRAM cells is shifted along said plane of the data reading layer in a direction away from said stack of layers that are aligned in said certain direction such that the data reading layer senses a fringe field from at least one adjacent data storage layer.

21. The MRAM structure of claim 20 wherein the data reading layer in each of the plurality of MRAM cells senses a fringe field from two adjacent data storage layers.

22. The MRAM structure of claim 1 wherein the second electrode has a uniform thickness and extends continuously along a certain axis through a plurality of MRAM cells.

23. The MRAM structure of claim 1 wherein the second electrode extends through a plurality of MRAM cells and has a thickness in sections between adjacent MRAM cells that is at least two times greater than the thickness of a section formed between a data reading layer and a data storage layer in each MRAM cell.

24. The MRAM structure of claim 1 wherein the second electrode is a patterned or a continuous element with a uniform thickness and connects with a conduction line that runs proximate to a plurality of MRAM cells.

25. The MRAM structure of claim 1 wherein one or both of the first and second current routing components are a diode wherein current routing is controlled by the arrangement of voltage on said three electrodes.

26. The MRAM structure of claim 1 wherein one or both of the first and second current routing components are a transistor wherein the current routing is controlled by a separate control line through the gate terminal of each transistor.

27. A method of forming a MRAM cell in a MRAM array containing a plurality of MRAM cells wherein each MRAM cell has a thermally assisted switching structure with separated read and write functions, comprising:
   (a) forming a first electrode on a substrate wherein said first electrode has a length along a first axis, a width along a second axis, and a thickness in a certain direction perpendicular to said first and second axes;
   (b) forming a patterned data storage section on said first electrode, said data storage section is a composite comprising:
      (1) a first diode that contacts said first electrode and allows a current to flow only through the data storage section between an overlying second electrode and the first electrode during a first period of time; and
      (2) a data storage layer formed on the first diode and having an upper surface which contacts a lower surface of said overlying second electrode, said data storage layer is comprised of a high anisotropy material with a magnetization that is switched by simultaneous application of a magnetic field and thermal heating;
   (c) forming the second electrode on said data storage layer;
   (d) forming a patterned data reading section on said second electrode; said data reading section is a composite comprising:
      (1) a data reading layer having a bottom surface that contacts a side of the second electrode opposite the data storage layer, said data reading layer is a magneto-resistive device having at least one free layer that is magneto-statically coupled to the data storage layer and produces a resistance change when the data storage layer magnetization switches; and
      (2) a second diode formed on the data reading layer that allows a current to flow only through the data reading section between the second electrode and an overlying third electrode during a second period of time; and
   (e) forming the third electrode on said second diode wherein said third electrode has a length along said first axis, a width along said second axis, and a thickness in said certain direction perpendicular to the first and second axes, said first electrode, second electrode, third electrode, data storage section, and data reading section form a stack of layers aligned in said certain direction.

28. The method of claim 27 wherein a write process comprises:
 (a) setting the second and third electrodes at a first voltage and setting the first electrode at a second voltage different than said first voltage;
 (b) flowing a heating current between the second electrode and first electrode through the data storage section while simultaneously applying a magnetic field to switch the magnetization direction in the data storage layer during a first period of time; and
 (c) removing the heating current and allowing the data storage layer to cool while maintaining said magnetic field.

29. The method of claim 27 wherein a read (sensing) process comprises:
 (a) setting the first and second electrodes at a first voltage and setting the third electrode at a second voltage different than the first voltage; and
 (b) flowing a sensing current between the second electrode and third electrode through the data reading section during said second period of time, said sensing current allows a voltage signal between the second and third electrodes to be detected that reflects the resistance in said data reading layer wherein said resistance is related to the magnetization direction in the data storage layer.

30. The method of claim 28 wherein the magnetic field applied to switch the data storage layer in said MRAM cell is a localized field generated by current carrying wires embedded in an insulation layer proximate to each of the plurality of MRAM cells, and each of the plurality of MRAM cells may be switched individually by a localized field.

31. The method of claim 28 wherein the magnetic field applied to switch the data storage layer is a wide range field that impinges on the plurality of MRAM cells and said writing process further comprises switching each of the plurality of MRAM cells to a same magnetization direction before applying the wide range field.

* * * * *